United States Patent [19]

Houston

[11] Patent Number: 4,956,815

[45] Date of Patent: Sep. 11, 1990

[54] MEMORY CELL WITH INCREASED STABILITY

[75] Inventor: Theodore W. Houston, Richardson, Tex.

[73] Assignee: Texas Instruments Incorporated, Dallas, Tex.

[21] Appl. No.: 252,291

[22] Filed: Sep. 30, 1988

[51] Int. Cl.$^5$ ............................................. G11C 11/40
[52] U.S. Cl. ..................................................... 365/154
[58] Field of Search ................. 365/154, 155, 156, 190

[56] References Cited

U.S. PATENT DOCUMENTS

| 4,638,463 | 1/1987 | Rockett, Jr. | 365/205 |
| 4,725,981 | 2/1988 | Rutledge | 365/154 |

OTHER PUBLICATIONS

"DMSP Dosimetry Data: A Space Measurement and Mapping of Upset Causing Phenomena", E. G. Gussenhower et al., IEEE Trans. Nuclear Science, vol. NS-34, pp. 1251-1255 (1987).
"An SEU Tolerant Memory Cell Derived from Fundamental Studies of SEU Mechanisms in SRAM", H. T. Weaver et al., IEEE Trans. Nuclear Science, vol. NS-34, pp. 1281-1286 (1987).
"Alpha Particle Induced Soft Errors in Dynamic Memories", T. C. May et al., IEEE Trans. Electronic Devices, vol. ED-26, p. 2 (1979).
"CMOS RAM Cosmetic Ray-Induced Error Rate Analysis", J. C. Pickel et al., IEEE Trans. on Nuclear Science, vol. NS-28, pp. 3962-3967 (1981).

Primary Examiner—James W. Moffitt
Attorney, Agent, or Firm—Raymond E. Fritz, Jr.; Stanton C. Braden; Melvin Sharp

[57] ABSTRACT

A memory cell is disclosed which operates in two stable states and where an asymmetry in current through the cell is required to change the state of the cell. The cell includes a current compensating device that supplies current under ionizing radiation in a direction that is opposite to that required to write into the cell.

12 Claims, 4 Drawing Sheets

MEMORY CELL WITH INCREASED STABILITY

BACKGROUND OF THE INVENTION

Static memory cells in certain environments in which radiation is present such as communication satellite orbital space, can be susceptible to short pulsed transient dose radiation such as gamma dot or short high pulsed gamma radiation. A more detailed explanation of the transient dose problem follows, but first, background information shall be given with respect to the structure and operation of a static memory cell with reference to FIG. 1 which illustrates a schematic drawing of a conventional CMOS (complementary metal oxide semiconductor) static memory cell, typically used in a static random access memory (SRAM). Memory cell 2 is constructed according to well known methods of cross-coupled inverter realization and thus CMOS inverters are used in memory cell 2. A first CMOS inverter 4 in memory cell 2 comprises p-channel transistor 6 and n-channel transistor 8 having their source-to drain paths connected in series between Vdd and ground, and having their gates tied together. The second CMOS inverter 5 in memory cell 2 is similarly constructed, with p-channel transistor 10 and n-channel transistor 12 having their source-to-drain paths connected in series between Vdd and ground and their gates are also common. The cross-coupling is accomplished by the gates of transistor 6 and 8 being connected to the drains of transistor 10 and 12 (node S1), and by the gates of transistors 10 and 12 being connected to the drains of transistors 6 and 8 (node S2). N-channel pass transistor 14 has its source-to-drain path connected between node S2 and a first bit line BL, and has its gate connected to word line WL. N-channel pass transistor 16 similarly has its source-to drain path connected between node S1 and a second bit line BL—, and has its gate also connected to word line WL. Pass transistors 14, 16 when enabled, allow data to pass into and out of memory cell 2 from bit lines BL and BL—respectively. Bit lines BL and BL carry data into and out of memory cell 2. Pass transistors 14, 16 are enabled by word line WL which is a function of the row address in an SRAM. The row address is decoded by a row (not shown) decoder in the SRAM such that one out of n word lines is enabled, where n is the number of rows of memory cells in the memory which is a function of memory density and architecture.

In operation, the voltages of nodes S1 and S2 will necessarily be logical complements of one another, due to the cross-coupled nature of CMOS inverters 4,5 within memory cell 2. When word line WL is energized by the row decoder (not shown), according to the row address received at address inputs to an address buffer (not shown) connected to the row decoder, pass transistors 14 and 16 will be turned on, coupling nodes S1 and S2 to bit lines BL and BL—, respectively. Accordingly, when word line WL is high, the state of memory cell 2 can establish a differential voltage on BL and BL—. Alternatively, peripheral circuitry forcing a voltage on BL and BL— can alter the state of memory cell 2. The sizes of the transistors shown in FIG. 1 are generally chosen such that when pass transistors 14 and 16 are turned on by word line WL, a differentially low voltage at bit line BL— with respect to bit line BL can force node S1 to a logic low level. However, the sizes of the transistors shown in FIG. 1 are also chosen such that when transistors 14 and 16 are on, a differentially high voltage at bit line B with respect to bit line BL— will not force node S2 high, nor will a differentially high voltage at bit line BL with respect to bit line BL force node S1 high. Therefore writing into memory cell 2 is accomplished by pulling the desired bit line and thus the desired side of cell 2 at either node S1 or node S2 low, which in turn due to feedback paths in cell 2, causes the opposite side of cell 2 to have a logic high state.

High short pulsed transient dosed radiation creates electron-hole pairs which get collected by electromagnetic fields within cell 2. This produces photo-current within cell 2 which can produce changes in voltages throughout the cell. Restated, the photo-current can cause logic upset in the memory. Note that the short pulsed transient dosed radiation such as gamma dot, is different from single event upset (SEU). One very distinct difference between these two situations is that for SEU only one node of a transistor is initially affected by radiation causing either the high node to go low or the low node high in voltage such that changes in voltage propagate through an associated memory cell. On the other hand for gamma dot, all transistors are affected. Furthermore, for gamma dot, whether the high or low node is affected more than the other is dependent upon the relative widths of the transistor attached to the nodes.

A reed therefore exists to harden static memory cells against short pulsed transient dose radiation.

OBJECTS OF THE INVENTION

It is an object of the invention to provide a new and improved memory cell.

It is another object of the invention to provide a new and improved memory cell with increased hardening against short pulse transient dose radiation.

These and other objects of the invention, together with the features and advantages thereof, will become apparent from the detailed specification when read together with the accompanying drawings in which applicable reference numerals have been carried forward.

SUMMARY OF THE INVENTION

The foregoing objects of the invention are accomplished by a short pulse transient dose hardened memory cell which includes a pair of inverters comprising a first and a second inverter. The memory cell further includes a current compensation device connected to a node of at least one of the inverters of the pair. The current compensation device is operable to move a node in the memory cell opposite in voltage to that which is used to WRITE into the cell.

A pair of transistors are connected to the inverters such that each transistor of the pair connects an associated input of one inverter with an associated output of the other inverter of the inverter pair. The transistor pair increases the RC time constant delay of the memory cell in propagating, through the circuit, undesired short high pulsed transient dose induced voltage changes without significantly slowing a memory cell WRITE operation.

DETAILED DESCRIPTION OF THE INVENTION

Figure 1:
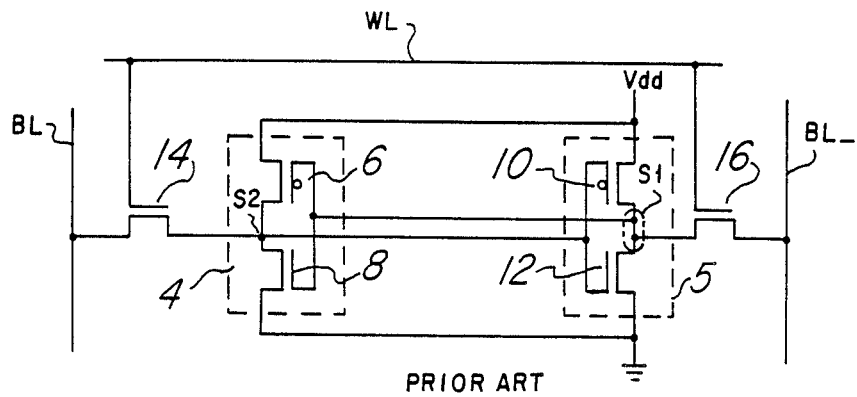
FIG. 1 is a schematic drawing of a conventional CMOS static memory cell.
Figure 2:
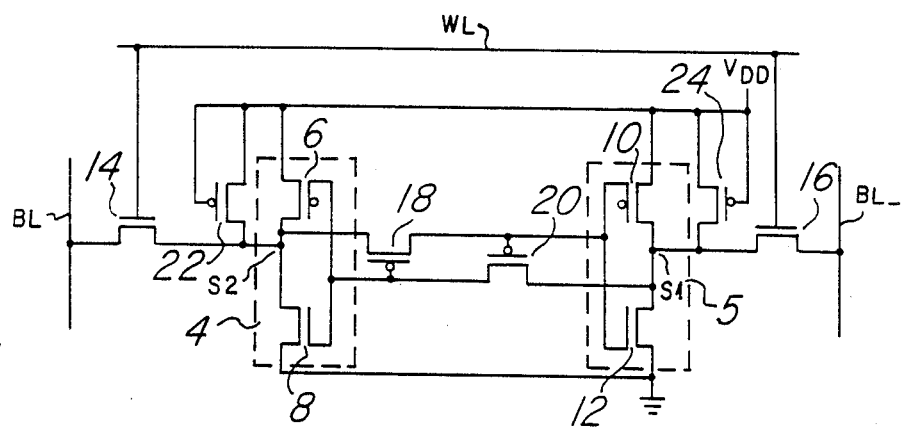
FIG. 2 is a schematic drawing of the preferred embodiment of the invention.

A schematic drawing of the preferred embodiment of the invention is illustrated in FIG. 2. This drawing is, the same as that shown in FIG. 1 with the exception that deletion mode p-channel transistors 18 and 20 have been added and are connected to the cross-coupling such that on source/drain region or terminal of each of these transistors is connected to the gate of the other transistor. Furthermore, p-channel transistors 22 and 24have been added and are connected by their drains to inverters 4 and 5 respectively. P-channel transistors 22 and 24 each have their sources connected to their gates. Note that for optimum protection from high short pulsed transient dose radiation that this circuit is built on a thin film resting on an insulator and therefore can be classified as an SOI device (silicon on insulator). However, the circuit can be built on bulk semiconductor and near full benefit can be achieved if at least the devices in the cross-coupling are isolated from the bulk a could be done with stacked polysilicon transistors.

Demonstration of the operation of the circuit in FIG. 2 shall be shown by example. The p-channel nature of transistors 18 and 20 increases their conductance with negative gate to source voltage and therefore the feedback mechanism for writing into the memory cell is not slowed significantly. Thus, current compensation devices have been added which move a node opposite in voltage to that which it has after it is intentionally written to by a memory cell WRITE (writing data into the cell) operation.

For the case where node S1 is initially logic high and node S2 is initially logic low, when attempting to write the opposite state into memory cell 2, node S1 must first be pulled to logic low. This logic low transition must be transmitted through transistor 20 which is in its most turned on state, to the common gate of transistors 6 and 8. Node S2 then changes from its initial logic low state to a logic high state in response to a low voltage at the gates of transistors 6 and 8. However, the transition of node S2 from low to high is transmitted through transistor 18, the gate of which is now at a voltage causing transistor 18 to be in a higher conducting state (logic low). Note that: while the WRITE is accomplished through transistors 22 and 24 in their most turned on state, the voltage maintaining feedback in memory cell 2 must always go through transistors 18 and 20, one of which is always in a lower conducting state (gate high). This feedback can alternatively be maintained by leakage or subthreshold current, meaning that alternatively, enhancement mode transistors can be used for transistors 18 and 20.

Normally transistors 22 and 24 are shut off due to their gate-source connection. However, after cell 2 receives a pulsed transient dose of radiation, the node of initially relatively high voltage as between node S2, which is the output of inverter 4, and node S1, which is the output of inverter 5, will tend to drop in voltage. However, electrons and holes created from electron-hole pairs will separate and collect in the drain and source respectively of transistor 22 and 24. Assuming node S2 was initially high before the transient dose and that it drops in voltage after the transient dose, transistor 22 will start conducting photo-current thereby substantially offsetting the drain to source photo-current through transistor 8 which causes the drop in voltage at node S2. Thus, node S2 is returned to its original voltage potential by transistor 22. Likewise, if node S1 is relatively high in voltage with respect to node S2, transistor 24 will pull node S1 back to its original voltage potential in response to cell 2's exposure to pulsed transient dose should node S1 begin to fall in voltage.

P-channel transistors 18 and 20 inhibit nodes S2 and S1 from going to a high voltage from a low voltage state in response to pulsed transient dose radiation due to the added resistance provided in the cross-coupling by resistive paths between source and drain regions of transistors 18 and 20 when each is in its lower conducting state. The effect of the added resistance increases the RC time constant delay, therefore preventing the negative effect of the short pulse transient dose induced voltage change from propagating through memory 2.

Figure 3:
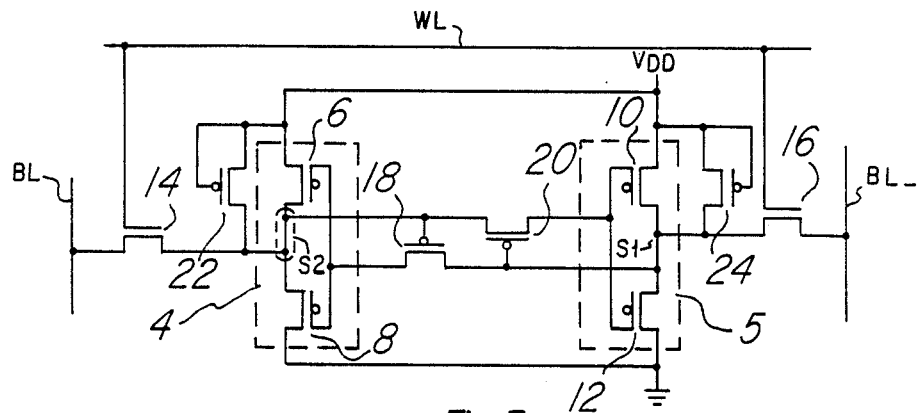
FIGS. 3 through 7 are schematic drawings of alternative embodiments of the invention.

FIG. 3 illustrates a schematic drawing of an alternative embodiment of the invention. This circuit may be viewed as the same circuit shown in FIG. 2 with transistor 18 and 20 exchanged in position and numerical label with one another. The discussion of the operation of the circuit in figure substantially applies to the operation of the circuit in FIG. 3 by substituting transistor labels "18" with "20" and vice versa.

Figure 4:
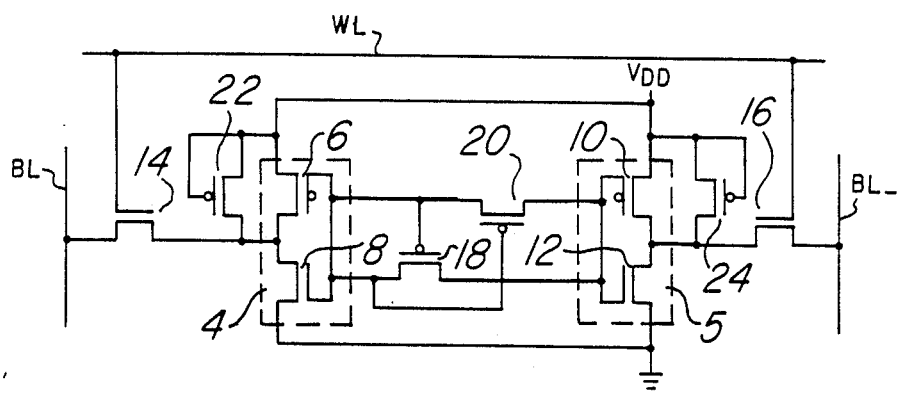

FIG. 4 illustrates a schematic drawing of another alternative embodiment of the invention which connects the gate of transistor 20 to the input of inverter 4 as shown in FIG. 4.

Figure 5:
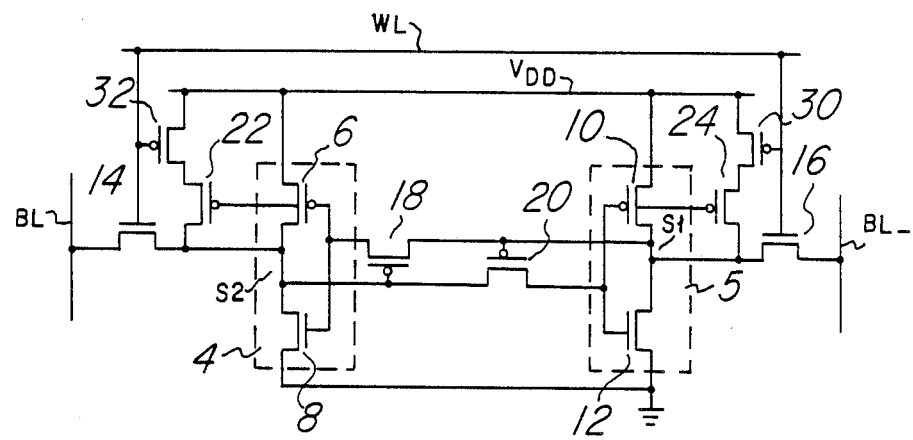

Another alternative embodiment is shown in the schematic drawing of FIG. 5. This figure is the same as the schematic of FIG. 2 with the exception that the gates of transistors 22 and 24 are connected to the gates of transistors 6 and 10 respectively rather than to the respective sources of transistors 22 and 24. Furthermore, p-channel transistor 32 has been added with its gate tied to the gate of transistor 14 and its drain tied to a source/drain of transistor 22. In a similar manner, transistor 30 has been added with its gate tied to the gate of transistor 16 and its drain tied to the source/drain of transistor 24. In this embodiment, further stability of the latch comprising inverters 4 and 5 is achieved. Normally p-channel transistors 6 and 10 are smaller than transistors 8 and 12 in order to aid in a WRITE operation into the cell. Consequently, the memory cell suffers some transient dose upset susceptibility because of this. However, through the addition of transistors 32 and 30 this particular type of cause of susceptibility is substantially eliminated. Further stability of memory cell operation is achieved because the combination of transistors 24 and 30 and the combination of transistors 22 and 32 act together in holding nodes S1 and S2 up in voltage when the gates of transistors 14 and 16 are in a logic low voltage state or rather, for instance, when not attempting to WRITE into the cell. When writing into the cell or rather when word line WL is high, note that transistors 32 and 30 are shut off and thus allow overide of a possible voltage holding effect of either transistors 22 or 24.

Figure 6:
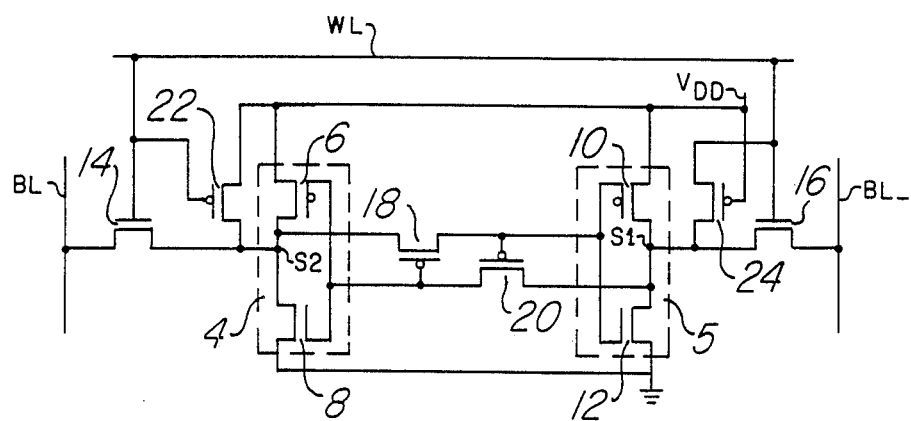

Still another alternative embodiment of the invention as shown in the schematic drawing of FIG. 6, is same as that shown in the schematic drawing of FIG. 2 with the exception that transistors 22 and 24 can only be deletion mode transistors with their gates tied to the gates of transistors 14 and 16 respectively, rather than to their own sources such that they act to hold up nodes S2 and S1 when word line WL is low.

Figure 7:
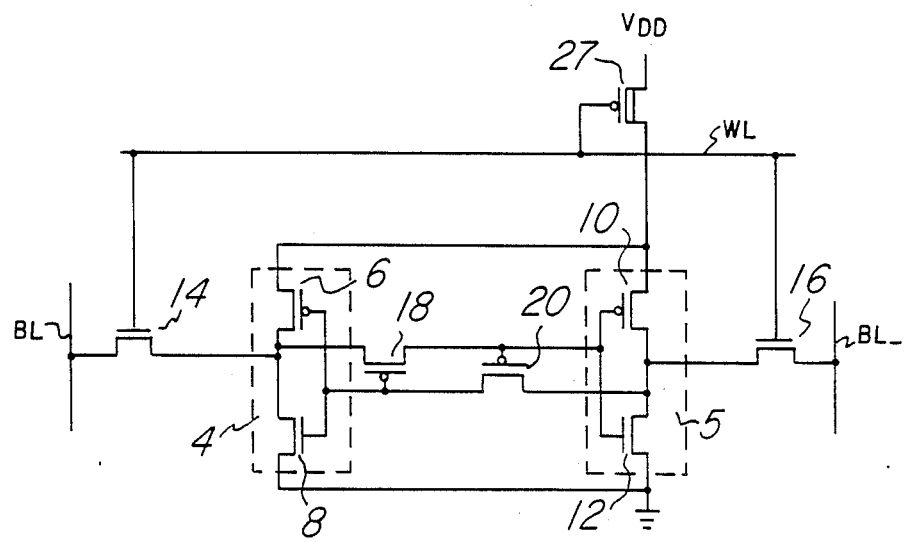

Another alternative embodiment of the invention shown in FIG. 6 is illustrated in the schematic drawing of FIG. 7. In FIG. 7 the device count (number of devices) is reduced since transistors 22 and 24 have been replaced by a single p-channel depletion mode transistor 27 with its drain tied to both a source/drain of transistors 6 and 10 and its gate tied to word line WL.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. N-channel transistors may be substituted for the previously discussed p-channel transistors consistently throughout. For example, p-channel transistors 18 and 20 shown in the drawings can be n-channel transistors say for instance should writing into the memory cell be accomplished by pulling the low node high. Furthermore, transistors may be connected to the cross-couplings of inverters of a variety other than the CMOS inverters illustrated in the foregoing drawings. It is contemplated that all such changes and additional embodiments are within the spirit and true scope of the invention as claimed below.

I claim:

1. A bi-stable logic device comprising:
   a set of cross-coupled inverters, said set of inverters including first and second inverters;
   a pair of transistors connected to the cross-coupling of the inverters so as to provide a time delay in effecting voltage changes at selected nodes within the cell via an impedance path through said transistors which lies between said selected nodes, each of said transistors including a gate, first and second terminals, the gate of a first transistor of said pair being connected to said first terminal of a second transistor of said pair in addition to the gate of a second transistor of said pair being connected to a first terminal of said first transistor; and
   a current compensation device, connected to each inverter, operable to supply current in response to ionizing radiation in a direction opposite to that required to change the state of the device.

2. A bi-stable logic device as recited in claim 1 wherein said second terminal of said first transistor of said pair is connected to the input of said first inverter and wherein said first terminal of said first transistor of said pair is connected to the output of said second inverter.

3. A bi-stable logic device as recited in claim 2 wherein said second terminal of said second transistor of said pair is connected to said input of said second inverter and wherein said first terminal of said second transistor of said pair is connected to said output of said first inverter.

4. A bi-stable logic device as recited in claim 1 wherein said second terminal of said first transistor of said pair is connected to the output of said first inverter and wherein said first terminal of said first transistor of said pair is connected to the input of said second inverter.

5. A bi-stable logic device as recited in claim 4 wherein said second terminal of said second transistor is connected to said output of said second inverter and wherein said first terminal of said second transistor of said pair is connected to said input of said first inverter.

6. A bi-stable logic device as recited in claim 1 wherein said transistors are metal oxide semiconductor field effect transistors.

7. A bi-stable logic device as recited in claim 1 wherein each inverter includes a p-channel transistor and a n-channel transistor.

8. A bi-stable logic device as recited in claim 1 wherein said current compensation device comprises a plurality of depletion mode transistors, each depletion mode transistor being associated with and connected to at lest one said inverter.

9. A bi-stable logic device as recited in claim 8 wherein said depletion mode transistors are p-channel transistors.

10. A bi-stable logic device as recited in claim 1 wherein said current compensation device comprises a plurality of p-channel transistors with each said p-channel transistor being connected to the output of an associated inverter, the source and drain of each said p-channel transistor being connected together.

11. A bi-stable logic device as recited in claim 1 wherein said logic device is operable in connection with pass transistors capable of passing data into and out of said bi-stable logic device, said bi-stable logic device further comprising a first p-channel transistor and a second p-channel transistor connected in series, the gate of said first p-channel transistor being connected to the gate of an associated pass transistor, the gate of said second p-channel transistor being connected to the input of an associated inverter, said source of said second p-channel transistor being connected to the output of said associated inverter.

12. A bi-stable logic device as recited in claim 1 wherein said logic device is operable in connection with pass transistors capable of passing data into and out of said bi-stable logic device, said bi-stable logic device further comprising a first n-channel transistor and a second n-channel transistor being connected to the gate of said first n-channel transistor being connected to the gate of an associated pass transistor the gate of said second n-channel transistor being connected to the input of an associated inverter, and said source of said second n-channel transistor being connected to the output of an associated inverter.

* * * * *